(12) United States Patent
Liu

(10) Patent No.: US 9,790,588 B2
(45) Date of Patent: Oct. 17, 2017

(54) HEATING DEVICE FOR EVAPORATION OF OLED MATERIAL

(71) Applicant: Shenzhen China Star Optoelectronics Technology Co., Ltd., Shenzhen, Guangdong (CN)

(72) Inventor: Yawei Liu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 451 days.

(21) Appl. No.: 14/426,979

(22) PCT Filed: Aug. 15, 2014

(86) PCT No.: PCT/CN2014/084450
§ 371 (c)(1),
(2) Date: Mar. 9, 2015

(87) PCT Pub. No.: WO2016/011687
PCT Pub. Date: Jan. 28, 2016

(65) Prior Publication Data
US 2016/0258051 A1    Sep. 8, 2016

(30) Foreign Application Priority Data

Jul. 22, 2014   (CN) .......................... 2014 1 0351750

(51) Int. Cl.
*B01D 7/00*    (2006.01)
*C23C 14/24*   (2006.01)
(Continued)

(52) U.S. Cl.
CPC ............ *C23C 14/243* (2013.01); *C23C 14/26* (2013.01); *H01L 51/56* (2013.01); *H05B 6/06* (2013.01);
(Continued)

(58) Field of Classification Search
USPC .................................................. 392/388–389
See application file for complete search history.

(56) References Cited

U.S. PATENT DOCUMENTS 2,793,609 A * 5/1957 Shen ........................ B01D 3/10
                                                      118/726
3,108,014 A * 10/1963 Gellar ..................... C23C 16/16
                                                      118/715
(Continued)

FOREIGN PATENT DOCUMENTS

CN         1495284 A    5/2004
CN       102935345 A    2/2013

*Primary Examiner* — Thor Campbell
(74) *Attorney, Agent, or Firm* — Andrew C. Cheng

(57) ABSTRACT

The present invention provides a heating device for evaporation of an OLED material, which includes a crucible (1) for receiving and containing therein an OLED material (10), a lower heating coil (2) surrounding outside an outer circumference of the body section (11) of the crucible (1), an upper heating coil (3) surrounding outside an outer circumference of the top cover section (13) of the crucible (1), a lower thermally conductive temperature homogenizing sleeve (4) arranged between the body section (11) and the lower heating coil (2), an upper thermally conductive temperature homogenizing sleeve (5) arranged between the top cover section (13) and the upper heating coil (3), and a thermal insulation ring (6) arranged between the upper and lower thermally conductive temperature homogenizing sleeves (5, 4). The upper and lower heating coils (3, 2) are each connected to a power supply for individually controlling a heating temperature of each of the top cover section (13) and the body section (11). The heating device prevents gaseous molecules of the OLED material (10) from getting condensed and solidified at a gas release hole (131) of the crucible (1) so as to prevent jamming and blocking of the gas release hole (131).

11 Claims, 6 Drawing Sheets

(51) Int. Cl.

| | | |
|---|---|---|
| C23C 14/26 | (2006.01) | |
| H01L 51/56 | (2006.01) | |
| H05B 6/06 | (2006.01) | |
| H05B 6/36 | (2006.01) | |
| H05B 6/26 | (2006.01) | |
| B05D 1/00 | (2006.01) | |
| C23C 14/14 | (2006.01) | |
| H01L 51/00 | (2006.01) | |

(52) U.S. Cl.
CPC .............. *H05B 6/26* (2013.01); *H05B 6/36* (2013.01); *H05B 6/367* (2013.01); *B05D 1/60* (2013.01); *C23C 14/14* (2013.01); *H01L 51/001* (2013.01)

(56) References Cited

U.S. PATENT DOCUMENTS

| | | | | |
|---|---|---|---|---|
| 4,451,499 A * | 5/1984 | Morimoto | ............. | B01J 19/088 117/108 |
| 4,812,326 A * | 3/1989 | Tsukazaki | ............. | B05B 1/24 118/624 |
| 4,856,457 A * | 8/1989 | Knauer | ............. | C30B 23/066 118/50.1 |
| 4,993,607 A * | 2/1991 | Brun | ............. | B22D 41/50 106/38.9 |
| 5,016,566 A * | 5/1991 | Levchenko | ............. | C23C 14/26 118/715 |
| 5,031,229 A * | 7/1991 | Chow | ............. | C23C 14/243 392/389 |
| 5,157,240 A * | 10/1992 | Chow | ............. | C23C 14/243 219/444.1 |
| 5,432,341 A * | 7/1995 | Gspann | ............. | C23C 14/243 250/251 |
| 5,705,226 A * | 1/1998 | Fukui | ............. | C23C 14/243 427/250 |
| 6,101,316 A * | 8/2000 | Nagashima | ............. | B01B 1/005 118/723 VE |
| 6,367,414 B2 * | 4/2002 | Witzman | ............. | C23C 14/243 118/718 |
| 7,359,630 B2 * | 4/2008 | Yi | ............. | C23C 14/243 118/726 |
| 7,641,737 B2 * | 1/2010 | Yi | ............. | C23C 14/243 118/726 |
| 7,672,575 B2 * | 3/2010 | Kato | ............. | C23C 16/4481 392/386 |
| 7,962,016 B2 * | 6/2011 | Choe | ............. | C23C 14/243 118/726 |
| 2007/0022955 A1 * | 2/2007 | Bender | ............. | C23C 14/26 118/726 |
| 2007/0283890 A1 * | 12/2007 | Park | ............. | C23C 14/243 118/727 |

* cited by examiner

HEATING DEVICE FOR EVAPORATION OF OLED MATERIAL

BACKGROUND OF THE INVENTION

1. Field of the Invention

The present invention relates to the field of OLED (Organic Light-Emitting Diode) manufacture, and in particular to a heating device for vapor deposition of an OLED material.

2. The Related Arts

An OLED (Organic Light-Emitting Diode) is a flat panel displaying technique of extremely prosperous future and it shows excellent displaying performance and also possesses various advantages, such as being self-luminous, simple structure, being ultra-thin, fast response speed, wide view angle, low power consumption, and being capable of achieving flexible displaying and is thus regarded as a "dream display". In addition, the investment of the manufacturing installation is far less than that of liquid crystal displays so that it has attracted the attention of major display manufacturers and becomes the mainstream of the three-generation display devices of the field of display technology.

An OLED often comprises: a substrate, an ITO (Indium Tin Oxide) transparent anode arranged on the substrate, an organic material layer formed on the ITO transparent anode, and a cathode formed on the organic material layer. The organic material layer is composed of: a hole injection layer (HIL), a hole transport layer (HTL) formed on the hole injection layer, an emissive layer (EML) formed on the hole transport layer, an electron transport layer (ETL) formed on the emissive layer, and an electron injection layer (EIL) formed on the electron transport layer. To increase the efficiency, the emissive layer often adopt a host/guest doping system.

Two operations are generally used to manufacture an OLED organic material film. For high-molecule OLED organic materials, solution based film forming process is used; however, such a process is still in laboratory test stage. For small-molecule OLED organic materials, a vacuum thermal evaporation based film forming process is commonly used currently. Such a process is widely used by most manufacturers of the flat panel display industry, such as Samsung and LG.

Film formation with vacuum thermal evaporation is to heat, in a vacuum environment of less than $5 \times 10^{-5}$ Pa, a sublimateable or meltable OLED material for changing from a solid state to a vapor state. Gas molecules are moving at a high speed to reach a glass substrate and get deposited, condensed, and solidified on the substrate to form a solid film of the OLED material. As shown in FIG. 1, a conventional heating device that used for deposition of OLED materials comprises a crucible 100 for receiving and containing an OLED material and a set of heating coil 200 set outside the crucible 100. The crucible 100 is provided with a gas release hole 150 in a center of a top thereof. FIG. 2 is a schematic view illustrating an operation process of the set of heating coil 200 and it can be seen from the drawing that an upper portion 210 and a primary portion 230 of the set of heating coil 200 cannot be individually controlled in respect of the temperatures thereof so that the temperatures can only be increased or decreased synchronously. FIG. 3 is a schematic view illustrating an operation process of the conventional heating device that is used for evaporation of an OLED material. Firstly, the set of heating coli 200 is energized and an OLED material 300 disposed inside the heating device starts to raise the temperature. When the temperature is increased to reach the evaporation temperature of OLED material 300, gaseous molecules of the OLED material 300 flows out of the gas release hole 150 to deposit on a substrate. When the OLED material 300 is almost running up for evaporation or when there will be an extended period of idle time of the experiments, the heating device needs to lower down the temperature and power supply to the set of coil 200 is cut off to decrease the overall temperature of the heating device, whereby gas molecules of the OLED material 300 may accumulate and solidify at the gas release hole 150, making the gas release hole 150 jammed, so that the manufacturing process must be interrupted for opening the chamber and processing. This lowers the manufacturing efficiency, increases work load, and also bring potential risk of quality change of the OLED material due to the OLED material being exposed to the atmosphere and thus contacting moisture and oxygen.

SUMMARY OF THE INVENTION

An object of the present invention is to provide a heating device for evaporation of an OLED material, which keeps a gas release hole at a relatively high temperature while lowers down the temperature of an OLED material to prevent gaseous molecules of the OLED material from getting solidified at the gas release hole thereby avoiding jamming of the gas release hole, maintaining manufacturing efficiency, and eliminating the potential risk of quality change of the OLED material resulting from contacting moisture and oxygen.

To achieve the object, the present invention provides a heating device for evaporation of an organic light-emitting diode (OLED) material, which comprises a crucible for receiving and containing therein an OLED material, the crucible comprising a body section and a top cover section connected to the body section, the top cover section having a top having a center in which a gas release hole is formed; and further comprises a lower heating coil that surrounds outside an outer circumference of the body section, an upper heating coil that surrounds outside an outer circumference of the top cover section, a lower thermally conductive temperature homogenizing sleeve arranged between the body section and the lower heating coil, an upper thermally conductive temperature homogenizing sleeve arranged between the top cover section and the upper heating coil, and a thermal insulation ring arranged between the upper and lower thermally conductive temperature homogenizing sleeves. The upper and lower heating coils are each connected to a power supply for individually controlling a heating temperature of each of the top cover section and the body section.

The lower thermally conductive temperature homogenizing sleeve is fixed to a platform.

The lower thermally conductive temperature homogenizing sleeve has a bottom on which a projection is formed and the platform comprises a recess formed therein to correspond to the projection so that the projection is receivable and retained in the recess. A thermal insulation pad is arranged between the projection and the recess so as to fix the lower thermally conductive temperature homogenizing sleeve to the platform.

The lower thermally conductive temperature homogenizing sleeve has a top in which a lower annular groove is formed and the upper thermally conductive temperature homogenizing sleeve has a bottom in which an upper annular groove is formed. The thermal insulation ring is fit in both the upper and lower annular grooves to separate the upper and lower thermally conductive temperature homogenizing sleeves from each other.

The lower thermally conductive temperature homogenizing sleeve has an inside diameter greater than an outside diameter of the body section of the crucible with a difference therebetween not greater than 10 mm; and the upper thermally conductive temperature homogenizing sleeve has an inside diameter greater than an outside diameter of the top cover section of the crucible with a difference therebetween not greater than 10 mm.

The upper thermally conductive temperature homogenizing sleeve has a height greater than a height of the top cover section of the crucible with a difference therebetween not greater than 10 mm.

The upper and lower heating coils have heating temperature ranges between room temperature and 1300° C. with control precision of temperature being less than 5° C.

The upper and lower thermally conductive temperature homogenizing sleeves are made of a material of stainless steel.

The thermal insulation ring is made of a material of ceramics and the thermal insulation pad is made of a material of ceramics.

The heating device for evaporation of the OLED material further comprises a thermally conductive temperature homogenizing plate set on and covering a top end of the upper thermally conductive temperature homogenizing sleeve. The thermally conductive temperature homogenizing plate has a center in which a through hole is formed. The through hole has a diameter greater than a diameter of the gas release hole.

The efficacy of the present invention is that the present invention provides a heating device for evaporation of an OLED material, which comprises two sets of upper and lower heating coils and two sets of upper and lower thermally conductive temperature homogenizing sleeves to respectively control the heating temperatures of the top cover section and the body section of the crucible in order to achieve lowering the temperature of the OLED material and at the same time, maintaining the gas release hole of the crucible at a relatively high temperature so as to prevent the gaseous molecules of the OLED material from getting solidified at the gas release hole thereby avoiding blocking of the gas release hole, maintaining manufacturing efficiency, and eliminating the potential risk of quality change resulting from the OLED material contacting moisture and oxygen.

BRIEF DESCRIPTION OF THE DRAWINGS

The technical solution, as well as beneficial advantages, of the present invention will be apparent from the following detailed description of an embodiment of the present invention, with reference to the attached drawings. In the drawings.

DETAILED DESCRIPTION OF THE PREFERRED EMBODIMENTS

Figure 1:
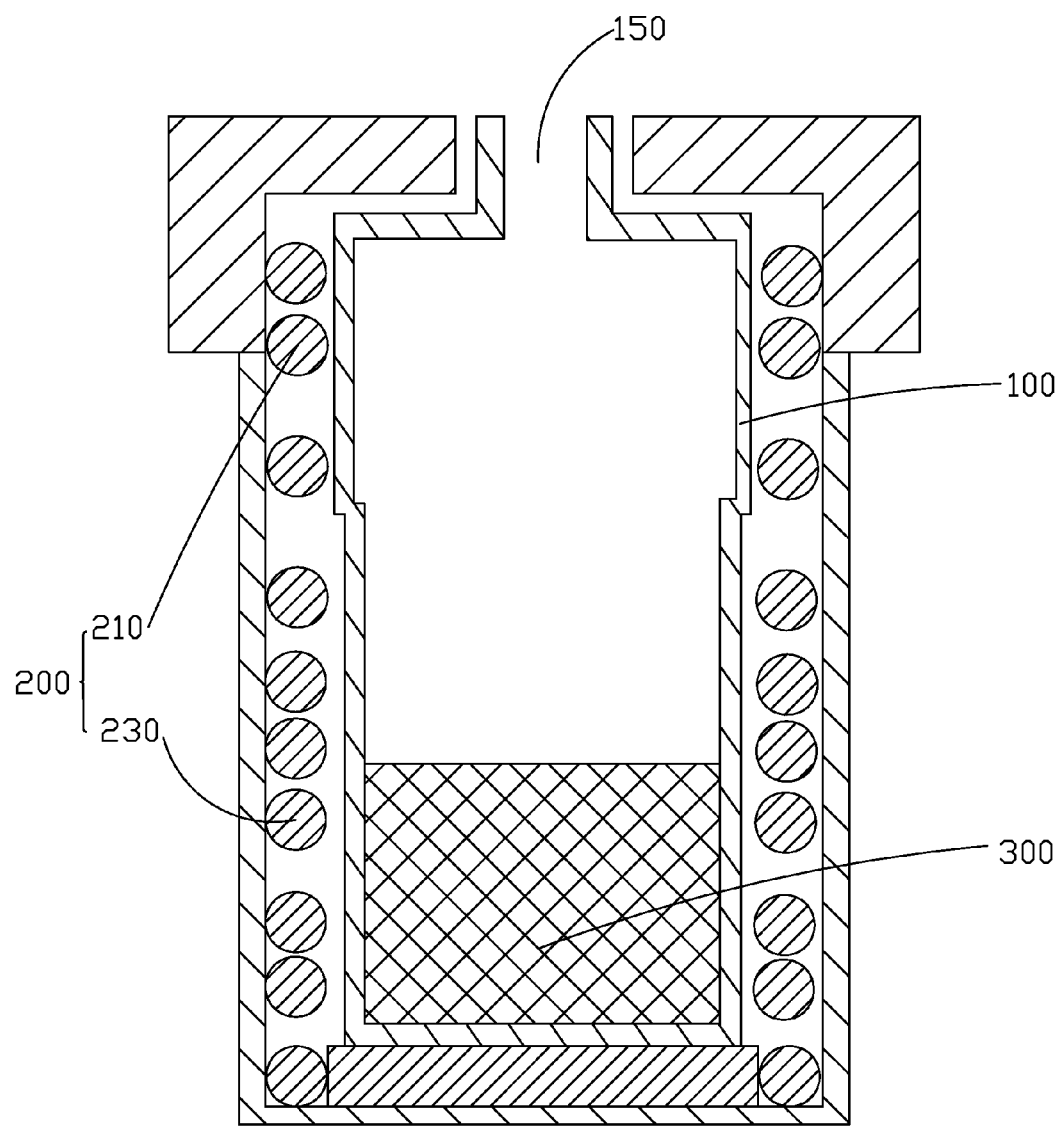
FIG. 1 is a schematic view showing the structure of a conventional heating device for evaporation of an OLED material.
Figure 2:
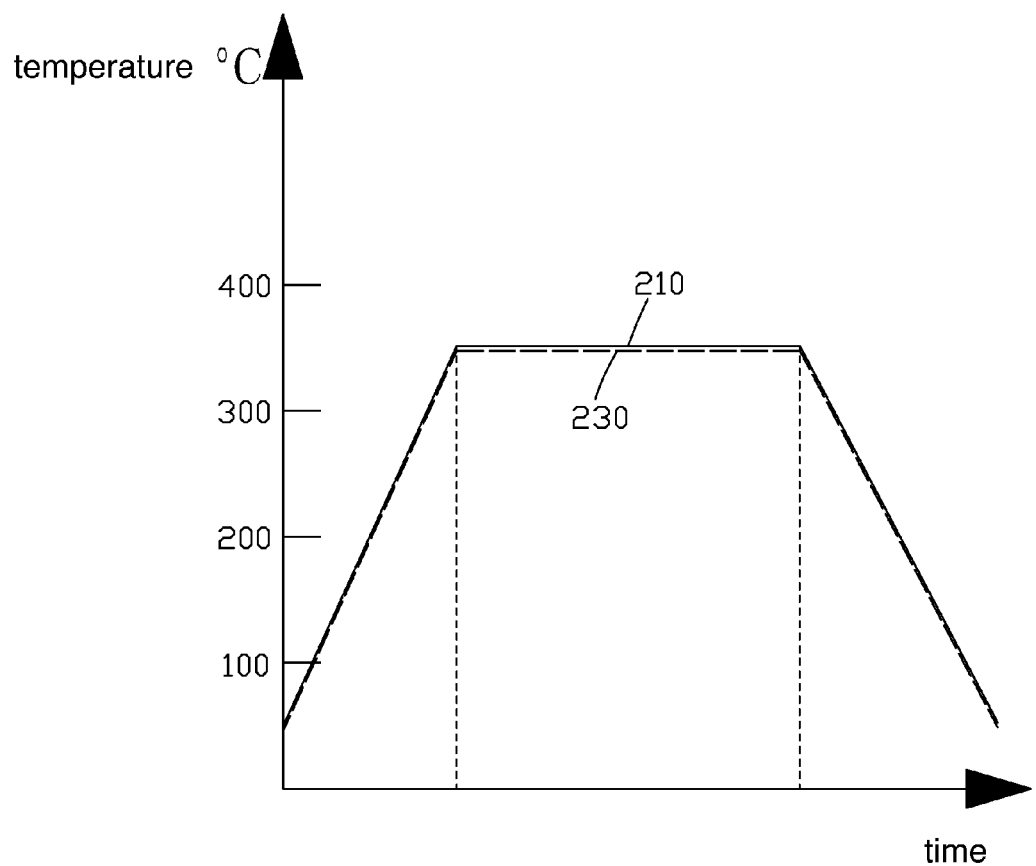
FIG. 2 is a schematic view illustrating an operation process of a heating coil of the conventional heating device for evaporation of an OLED material.
Figure 3:
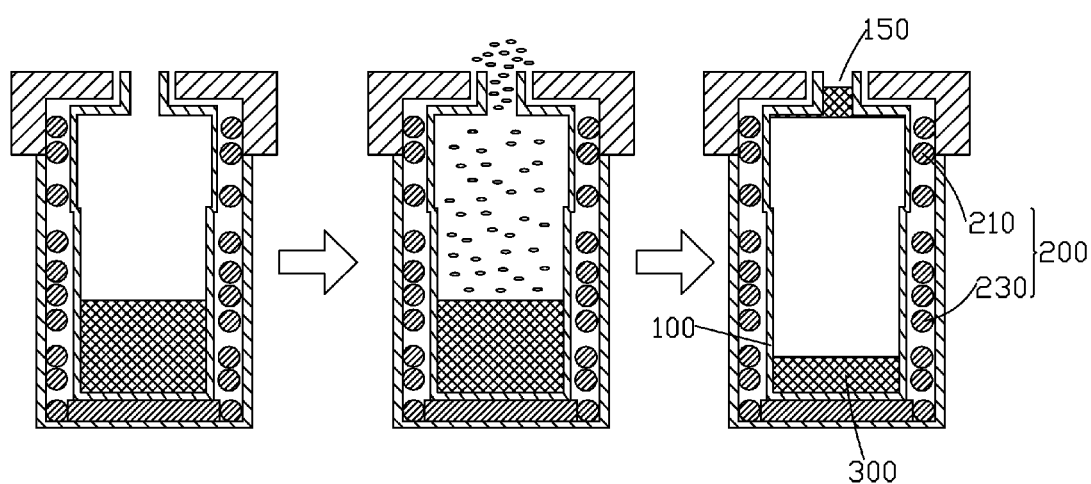
FIG. 3 is a schematic view illustrating an operation process of the conventional heating device t for evaporation of an OLED material.
Figure 4:
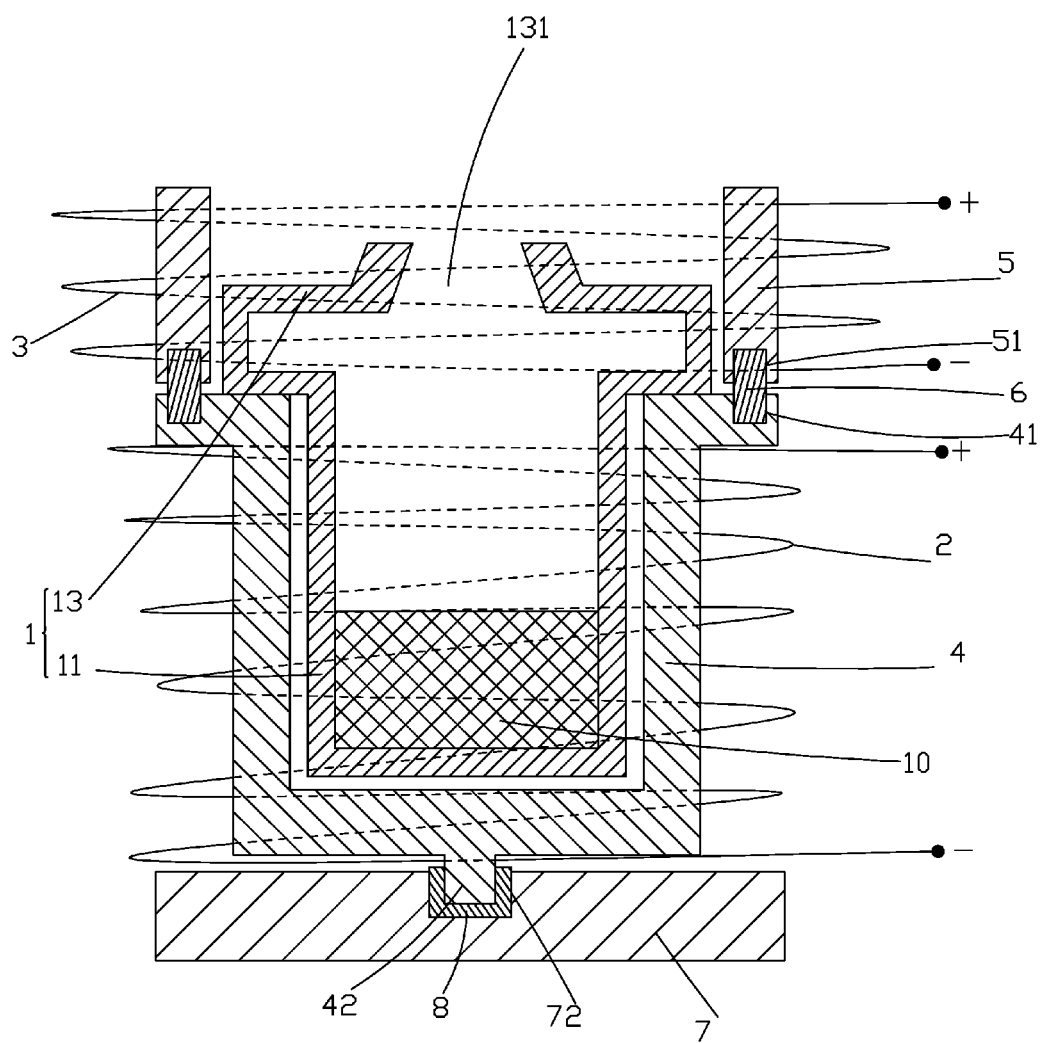
FIG. 4 is a schematic view showing a heating device for evaporation of an OLED material according to an embodiment of the present invention.

Referring to FIG. 4, a schematic view is given to show a heating device for evaporation of an OLED (Organic Light-Emitting Diode) material according to an embodiment of the present invention. The heating device for evaporation of an OLED material comprises a crucible 1 for receiving and containing therein an OLED material 10. The crucible 1 comprises a body section 11 and a top cover section 13 connected to the body section 11. The top cover section 13 has a top having a center in which a gas release hole 131 is formed. The OLED material 10 can be an organic material used to form a film of an OLED organic layer or a metallic material, such as LIF, Mg/Ag, Li/Al, used to form a film of an OLED metal cathode. The gas release hole 131 provides a channel for the gaseous molecules of the OLED material, after being heated and evaporated, to flow out.

A key point here is that the heating device for evaporation of an OLED material further comprises a lower heating coil 2 that surrounds outside an outer circumference of the body section 11, an upper heating coil 3 that surrounds outside an outer circumference of the top cover section 13, a lower thermally conductive temperature homogenizing sleeve 4 arranged between the body section 11 and the lower heating coil 2, an upper thermally conductive temperature homogenizing sleeve 5 arranged between the top cover section 13 and the upper heating coil 3, and a thermal insulation ring 6 arranged between the upper and lower thermally conductive temperature homogenizing sleeves 5, 4.

The upper and lower heating coils 3, 2 are each connected to a power supply for individually controlling a heating temperature of each of the top cover section 13 and the body section 11. The heating temperature ranges of the upper and lower heating coils 3, 2 are between the room temperature and 1300° C. with control precision of temperature being less than 5° C., making it suitable for heating organic materials that have low evaporation temperatures and also suitable for heating metallic materials that have high evaporation temperatures.

Since the heating temperatures of the top cover section 13 and the body section 11 are independently and respectively controlled by the upper and lower heating coils 3, 2, the temperatures of the top cover section 13 and the body section 11 could be made different in order to realize lowering of the temperature of the body section 11 and simultaneously maintaining the top cover section 13 and the gas release hole 131 at a relatively high temperature to prevent condensation and solidification of the gaseous molecules of the OLED material at the gas release hole 131 thereby avoiding blocking of the gas release hole 131.

The upper and lower thermally conductive temperature homogenizing sleeves 5, 4 provide functions of heat transfer and homogenization of temperature to respectively achieve homogeneity of heating of the top cover section 13 and the body section 11 of the crucible 1. The upper and lower thermally conductive temperature homogenizing sleeves 5, 4 are separated from each other by a thermal insulation ring 6 to prevent heat transfer between the upper and lower thermally conductive temperature homogenizing sleeves 5, 4 and thus influence of temperature control. Specifically, the lower thermally conductive temperature homogenizing sleeve 4 has a top in which a lower annular groove 41 is formed and the upper thermally conductive temperature homogenizing sleeve 5 has a bottom in which an upper annular groove 51 is formed. The thermal insulation ring 6 is fit in both the upper and lower annular grooves 51, 41 to separate the upper and lower thermally conductive temperature homogenizing sleeves 5, 4 from each other.

Further, to accommodate thermal expansion phenomenon, the lower thermally conductive temperature homogenizing sleeve 4 is structured to have an inside diameter greater than an outside diameter of the body section 11 of the crucible 1 with a difference between the two not greater than 10 mm; and the upper thermally conductive temperature homogenizing sleeve 5 is structured to have an inside diameter greater than an outside diameter of the top cover section 13 of the crucible 1 with a difference between the two not greater than 10 mm.

The upper thermally conductive temperature homogenizing sleeve 5 has a height that is greater than a height of the top cover section 13 of the crucible 1 with a difference between the two not greater than 10 mm, so that, on the one hand, the gas release hole 131 can be maintained at a relatively high temperature, and, on the other hand, the crucible 1 could be readily removed out.

The upper and lower thermally conductive temperature homogenizing sleeves 5, 4 are made of materials that have excellent thermal conductivity, could bear a high temperature of 1300° C., are not easy to oxidize, do not continuously release gases at high temperatures, do not release dusts, and are suitable for use in a vacuum environment. Preferably, the materials that are used to make the upper and lower thermally conductive temperature homogenizing sleeves 5, 4 are stainless steels.

The thermal insulation ring 6 is made of a material that has excellent thermal insulation property and is suitable for use in a vacuum environment. Preferably, the material that is used to make the thermal insulation ring 6 is a ceramic material.

The lower thermally conductive temperature homogenizing sleeve 4 is fixed to a platform 7. Specifically, the lower thermally conductive temperature homogenizing sleeve 4 has a bottom on which a projection 42 is formed. The platform 7 comprises a recess 72 formed therein to correspond to the projection 42 so that the projection 42 is receivable and retained in the recess 72. Further, a thermal insulation pad 8 is arranged between the projection 42 and the recess 72 to fix the lower thermally conductive temperature homogenizing sleeve 4 on the platform 7 and also to ensure verticality of the entirety of the heating device.

The thermal insulation pad 8 is made of a material that also has excellent thermal insulation property and is suitable for use in a vacuum environment. Preferably, the material that is used to make the thermal insulation pad 8 is a ceramic material.

Figure 5:
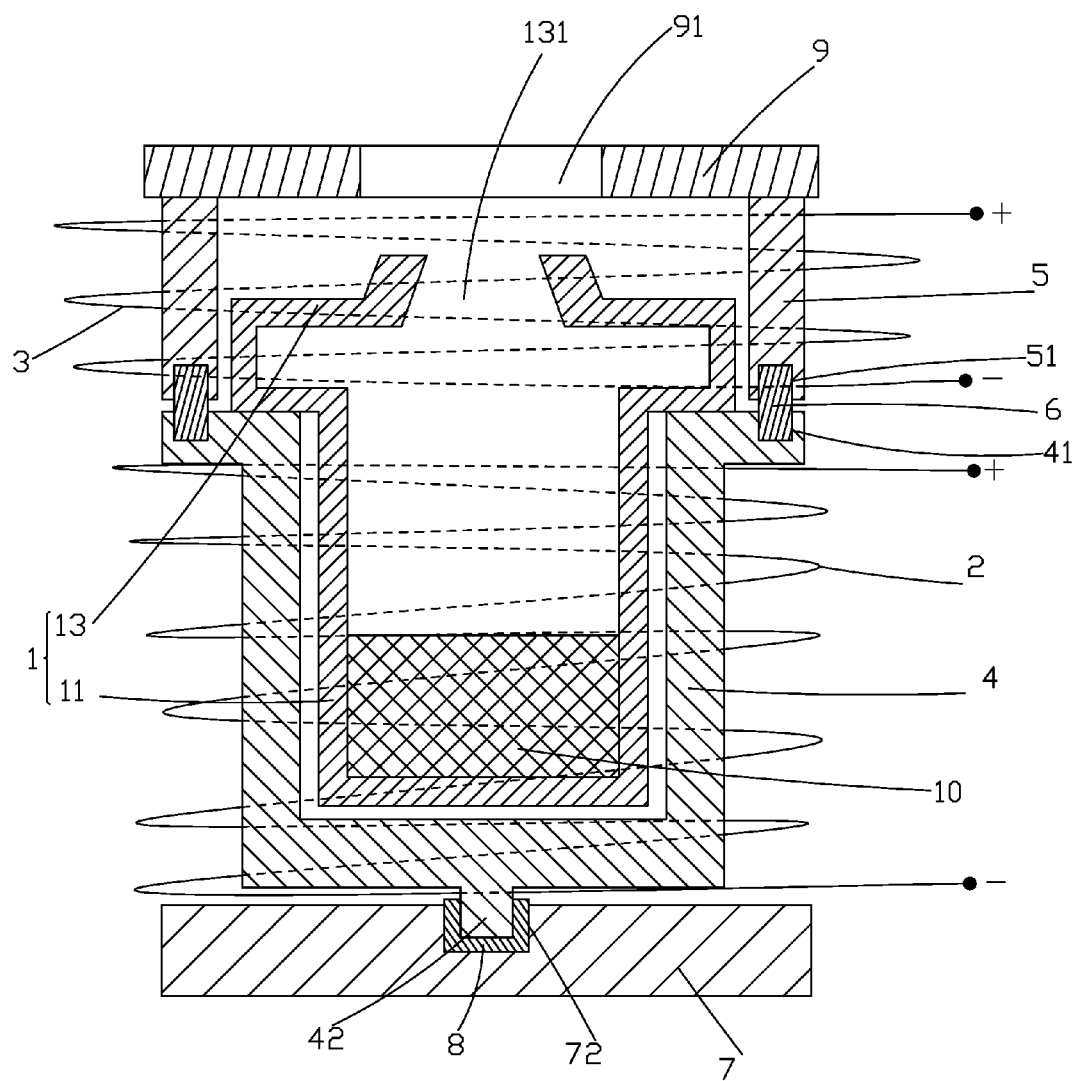
FIG. 5 is a schematic view showing a heating device for evaporation of an OLED material according to another embodiment of the present invention.

Referring to FIG. 5, a schematic view is given to show a heating device for evaporation of an OLED material according to another embodiment of the present invention. The instant embodiment is made on the basis of the previous embodiment by providing a thermally conductive temperature homogenizing plate 9 that is set on and covers a top end of the upper thermally conductive temperature homogenizing sleeve 5 so as to better maintain the gas release hole 131 at a relatively high temperature, avoiding blocking of the gas release hole 131. The thermally conductive temperature homogenizing plate 9 has a center in which a through hole 91 is formed and the through hole 91 has a diameter that is greater than a diameter of the gas release hole 131 to achieve smooth flow of the gaseous molecules of the OLED material out of the channel.

A material that can be used to make the thermally conductive temperature homogenizing plate 9 is stainless steels.

Figure 6:
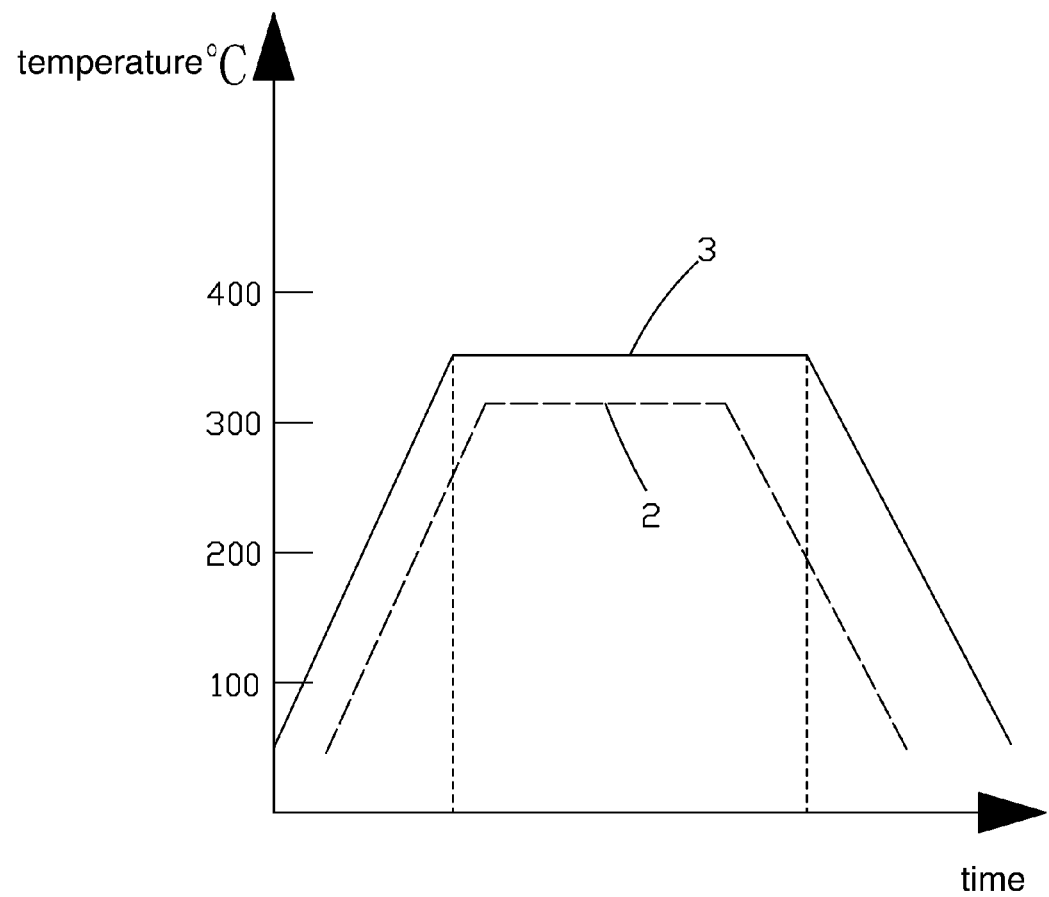
FIG. 6 is a schematic view illustrating operation processes of an upper coil and a lower coil of the heating device for evaporation of an OLED material according to the present invention.

Referring to FIG. 6, a schematic view is given to illustrate operation processes of the upper coil 3 and the lower coil 2 of the heating device for evaporation of an OLED material according to the present invention. An operation of using the heating device for evaporation of an OLED material is that firstly, electrical power is supplied to the upper heating coil 3 to heat the top cover section 13 of the crucible 1 such that the temperature of the top cover section 13 is raised to the evaporation temperature of the OLED material 10 and the temperature is controlled so as to be lower than cracking temperature of the OLED material 10 by at least 5° C.; electrical power is supplied to the lower heating coil 2 to heat the body section 11 of the crucible 1 such that the temperature of the body section 11 is raised to the evaporation temperature of the OLED material 10 to carry out evaporation of the OLED material 10; after the evaporation, the supply of electrical power to the lower heating coil 2 is first cut off to lower down the temperature of the body section 11 of the crucible 1, while the upper heating coil 3 is maintained at the evaporation temperature of the OLED material 10 to prevent condensation and solidification of the gaseous molecules of the OLED material 10 at the gas release hole 131 in order to prevent the gas release hole 131 from being jammed and blocked and when the temperature of the body section 11 is lowered down to a level lower than 200° C. and no gaseous molecules of the OLED material 10 have been generated, the supply of electrical power to the upper heating coil 3 is cut off to allow the temperature of the top cover section 13 of the crucible 1 to gradually lower down.

In summary, the present invention provides a heating device for evaporation of an OLED material, which comprises two sets of upper and lower heating coils and two sets of upper and lower thermally conductive temperature homogenizing sleeves to respectively control the heating temperatures of the top cover section and the body section of the crucible in order to achieve lowering the temperature of the OLED material and at the same time, maintaining the gas release hole of the crucible at a relatively high temperature so as to prevent the gaseous molecules of the OLED material from getting solidified at the gas release hole thereby avoiding blocking of the gas release hole, maintaining manufacturing efficiency, and eliminating the potential risk of quality change resulting from the OLED material contacting moisture and oxygen.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A heating device for evaporation of an organic light-emitting diode (OLED) material, comprising a crucible for receiving and containing therein an OLED material, the crucible comprising a body section and a top cover section connected to the body section, the top cover section having a top having a center in which a gas release hole is formed, and further comprising a lower heating coil that surrounds outside an outer circumference of the body section, an upper heating coil that surrounds outside an outer circumference of the top cover section, a lower thermally conductive temperature homogenizing sleeve arranged between the body section and the lower heating coil, an upper thermally conductive temperature homogenizing sleeve arranged between the top cover section and the upper heating coil, and a thermal insulation ring arranged between the upper and lower thermally conductive temperature homogenizing sleeves, the upper and lower heating coils being each connected to a power supply for individually controlling a heating temperature of each of the top cover section and the body section.

2. The heating device for evaporation of the OLED material as claimed in claim 1, wherein the lower thermally conductive temperature homogenizing sleeve is fixed to a platform.

3. The heating device for evaporation of the OLED material as claimed in claim 2, wherein the lower thermally conductive temperature homogenizing sleeve has a bottom on which a projection is formed and the platform comprises a recess formed therein to correspond to the projection so that the projection is receivable and retained in the recess, a thermal insulation pad being arranged between the projection and the recess so as to fix the lower thermally conductive temperature homogenizing sleeve to the platform.

4. The heating device for evaporation of the OLED material as claimed in claim 1, wherein the lower thermally conductive temperature homogenizing sleeve has a top in which a lower annular groove is formed and the upper thermally conductive temperature homogenizing sleeve has a bottom in which an upper annular groove is formed, the thermal insulation ring being fit in both the upper and lower annular grooves to separate the upper and lower thermally conductive temperature homogenizing sleeves from each other.

5. The heating device for evaporation of the OLED material as claimed in claim 1, wherein the lower thermally conductive temperature homogenizing sleeve has an inside diameter greater than an outside diameter of the body section of the crucible with a difference therebetween not greater than 10 mm; and the upper thermally conductive temperature homogenizing sleeve has an inside diameter greater than an outside diameter of the top cover section of the crucible with a difference therebetween not greater than 10 mm.

6. The heating device for evaporation of the OLED material as claimed in claim 5, wherein the upper thermally conductive temperature homogenizing sleeve has a height greater than a height of the top cover section of the crucible with a difference therebetween not greater than 10 mm.

7. The heating device for evaporation of the OLED material as claimed in claim 1, wherein the upper and lower heating coils have heating temperature ranges between room temperature and 1300° C. with control precision of temperature being less than 5° C.

8. The heating device for evaporation of the OLED material as claimed in claim 1, wherein the upper and lower thermally conductive temperature homogenizing sleeves are made of a material of stainless steel.

9. The heating device for evaporation of the OLED material as claimed in claim 3, wherein the thermal insulation ring is made of a material of ceramics and the thermal insulation pad is made of a material of ceramics.

10. The heating device for evaporation of the OLED material as claimed in claim 1 further comprising a thermally conductive temperature homogenizing plate set on and covering a top end of the upper thermally conductive temperature homogenizing sleeve, the thermally conductive temperature homogenizing plate having a center in which a through hole is formed, the through hole having a diameter greater than a diameter of the gas release hole.

11. A heating device for evaporation of an organic light-emitting diode (OLED) material, comprising a crucible for receiving and containing therein an OLED material, the crucible comprising a body section and a top cover section connected to the body section, the top cover section having a top having a center in which a gas release hole is formed, and further comprising a lower heating coil that surrounds outside an outer circumference of the body section, an upper heating coil that surrounds outside an outer circumference of the top cover section, a lower thermally conductive temperature homogenizing sleeve arranged between the body section and the lower heating coil, an upper thermally conductive temperature homogenizing sleeve arranged between the top cover section and the upper heating coil, and a thermal insulation ring arranged between the upper and lower thermally conductive temperature homogenizing sleeves, the upper and lower heating coils being each connected to a power supply for individually controlling a heating temperature of each of the top cover section and the body section;

wherein the lower thermally conductive temperature homogenizing sleeve is fixed to a platform;

wherein the lower thermally conductive temperature homogenizing sleeve has a bottom on which a projection is formed and the platform comprises a recess formed therein to correspond to the projection so that the projection is receivable and retained in the recess, a thermal insulation pad being arranged between the projection and the recess so as to fix the lower thermally conductive temperature homogenizing sleeve to the platform;

wherein the lower thermally conductive temperature homogenizing sleeve has a top in which a lower annular groove is formed and the upper thermally conductive temperature homogenizing sleeve has a bottom in which an upper annular groove is formed, the thermal insulation ring being fit in both the upper and lower annular grooves to separate the upper and lower thermally conductive temperature homogenizing sleeves from each other;

wherein the lower thermally conductive temperature homogenizing sleeve has an inside diameter greater than an outside diameter of the body section of the crucible with a difference therebetween not greater than 10 mm; and the upper thermally conductive temperature homogenizing sleeve has an inside diameter greater than an outside diameter of the top cover section of the crucible with a difference therebetween not greater than 10 mm;

wherein the upper thermally conductive temperature homogenizing sleeve has a height greater than a height of the top cover section of the crucible with a difference therebetween not greater than 10 mm;

wherein the upper and lower heating coils have heating temperature ranges between room temperature and 1300° C. with control precision of temperature being less than 5° C.;

wherein the upper and lower thermally conductive temperature homogenizing sleeves are made of a material of stainless steel; and wherein the thermal insulation ring is made of a material of ceramics and the thermal insulation pad is made of a material of ceramics.

* * * * *